United States Patent
Bergin et al.

(10) Patent No.: US 10,867,083 B2
(45) Date of Patent: Dec. 15, 2020

(54) TECHNIQUE FOR GENERATING APPROXIMATE DESIGN SOLUTIONS

(71) Applicant: AUTODESK, INC., San Rafael, CA (US)

(72) Inventors: Michael Bergin, El Cerrito, CA (US); Mark Thomas Davis, Mill Valley, CA (US)

(73) Assignee: AUTODESK, INC., San Rafael, CA (US)

( * ) Notice: Subject to any disclaimer, the term of this patent is extended or adjusted under 35 U.S.C. 154(b) by 1220 days.

(21) Appl. No.: 14/951,349

(22) Filed: Nov. 24, 2015

(65) Prior Publication Data
US 2016/0147914 A1    May 26, 2016

Related U.S. Application Data

(60) Provisional application No. 62/084,490, filed on Nov. 25, 2014.

(51) Int. Cl.
*G06F 30/20* (2020.01)
*G05B 19/4097* (2006.01)
(Continued)

(52) U.S. Cl.
CPC ......... *G06F 30/20* (2020.01); *G05B 19/4097* (2013.01); *G06F 16/444* (2019.01);
(Continued)

(58) Field of Classification Search
CPC ...... G05B 19/4097; G05B 2219/32089; G05B 2219/35012; G05B 2219/35021;
(Continued)

(56) References Cited

U.S. PATENT DOCUMENTS 5,510,995 A * 4/1996 Oliver ................ G05B 19/4099
345/419
8,392,160 B2   3/2013 Brincat et al.
(Continued)

FOREIGN PATENT DOCUMENTS

CN    101038599 A    9/2007
JP    05-081355 A    4/1993

OTHER PUBLICATIONS

Non-final Office Action for U.S. Appl. No. 14/951,310 dated Jun. 7, 2018, 21 pages.
(Continued)

*Primary Examiner* — Jay Hann
(74) *Attorney, Agent, or Firm* — Artegis Law Group, LLP

(57) ABSTRACT

A design application interacts with an end-user to generate design problem geometry that reflects a design problem to be solved. Various design objectives, design constraints, boundary conditions, and other design criteria may be associated with the design problem geometry via the design application. When the design problem is sufficiently well defined, a client-side solver generates a solution approximation using a coarse multi-objective solver. The client-side solver favors speed over accuracy, and so the solution approximation provides only a rough representation of various attributes of potentially feasible design solutions. Based on the solution approximation, the end-user may correct any omissions, mistakes, and so forth, before executing pay-per-service cloud-based parallel solver.

23 Claims, 9 Drawing Sheets

(51) Int. Cl.
     G06T 19/20    (2011.01)
     G06F 16/44    (2019.01)
(52) U.S. Cl.
     CPC .... *G06T 19/20* (2013.01); *G05B 2219/32089*
         (2013.01); *G05B 2219/35012* (2013.01); *G05B
               2219/35021* (2013.01); *G05B 2219/49301*
                       (2013.01); *Y02P 80/40* (2015.11)
(58) Field of Classification Search
     CPC ..... G05B 2219/49301; G06F 17/30061; G06F
                 17/50; G06F 17/5009; G06F 3/0481;
             G06F 3/04847; G06T 15/10; G06T 19/20;
                                              Y02P 80/40
     See application file for complete search history.

(56)               References Cited

U.S. PATENT DOCUMENTS

| | | | |
|---|---|---|---|
| 8,589,125 | B2 | 11/2013 | Mori et al. |
| 8,666,702 | B2 | 3/2014 | Schell |
| 8,818,769 | B2 * | 8/2014 | Trainer ................ G06F 30/00 703/1 |
| 9,785,727 | B1 | 10/2017 | Wilson |
| 2003/0210241 | A1 | 11/2003 | Minami et al. |
| 2005/0038821 | A1 | 2/2005 | Wallen et al. |
| 2006/0058985 | A1 * | 3/2006 | Arslan ................ G06F 17/5095 703/2 |
| 2006/0066609 | A1 | 3/2006 | Iodice et al. |
| 2007/0078634 | A1 | 4/2007 | Krishnapillai |
| 2007/0118243 | A1 | 5/2007 | Schroeder et al. |
| 2008/0222110 | A1 * | 9/2008 | Hayashi ................ G06F 16/93 |
| 2008/0319928 | A1 * | 12/2008 | Hashimoto ......... G06F 17/5009 706/13 |
| 2009/0306801 | A1 | 12/2009 | Sivak et al. |
| 2010/0057652 | A1 * | 3/2010 | Seshan ................ G06Q 10/047 706/19 |
| 2013/0170171 | A1 | 7/2013 | Wicker et al. |
| 2013/0233618 | A1 | 9/2013 | Nakano et al. |
| 2014/0108953 | A1 | 4/2014 | Greene et al. |
| 2015/0099059 | A1 | 4/2015 | Harjee et al. |
| 2015/0324489 | A1 * | 11/2015 | Onodera ............. G06F 17/5086 703/1 |
| 2015/0356207 | A1 | 12/2015 | Reitman et al. |
| 2015/0362898 | A1 * | 12/2015 | Potter ................ G05B 19/4099 700/98 |

OTHER PUBLICATIONS

Arieff, A. 2013. New Forms that Function Better. MIT Technology Review http://www.technologyreview.com/review/517596/new-formsthat-function-better/ pp. 1-10.
Bertini, E., Dell'Aquila, L., & Santucci, G. 2005. "SpringView: cooperation of radviz and parallel coordinates for view optimization and clutter reduction". In Coordinated and Multiple Views in Exploratory Visualization. (8 pages).
Draper, G., Livnat, Y., & Riesenfeld, R. F. 2009. "A survey of radial methods for information visualization". In Visualization and Computer Graphics. pp. 1-45.
Dunne, C. and Shneiderman, B. 2013. "Motif simplification: improving network visualization readability with fan, connector, and clique glyphs". In Proc CHI '13 (14 pages).
Flager, F. and Haymaker, J. 2007. "A Comparison of Multidisciplinary Design, Analysis and Optimization Processes in the Building Construction and Aerospace Industries". In Proc. of the 24th International Conference on Information Technology in Construction. pp. 1-12.
Flager F, Welle B, Bansal P, Soremekun G, Haymaker J. 2009. "Multidisciplinary process integration and design optimization of a classroom building". Journal of Information Technology in Construction, vol. 14. 595-612.

Gerber, D. J., Lin, S.-H., Pan, B. and Solmaz, A. S. 2012. "Design optioneering: multi-disciplinary design optimization through parameterization, domain integration and automation of a genetic algorithm". In Proc. Symposium on Simulation for Architecture and Urban Design, Society for Computer Simulation International. (pp. 23-30).
Graham, M., & Kennedy, J. 2003. "Using curves to enhance parallel coordinate visualisations". In Information Visualization, 2003.
Grossman, T., Matejka, T. and Fitzmaurice, G. 2010. "Chronicle: capture, exploration, and playback of document workflow histories". In Proc UIST '10. (pp. 143-152).
Hauser, H., Ledermann, F., & Doleisch, H. 2002. "Angular brushing of extended parallel coordinates". In Information Visualization, 2002. (4 pages).
Holzer, D., Hough, R. and Burry, M. 2007. "Parametric Design and Structural Optimisation for Early Design Exploration". International, Journal of Architectural Computing, vol. 5, 4. 625-643.
Lunzer, A. and Hornbæk, K. 2008. "Subjunctive interfaces: Extending applications to support parallel setup, viewing and control of alternative scenarios". ACM Transactions on Computer-Human Interaction vol. 14, 4. 1-17.
Maile, T., Fischer, M., Bazjanac, V. 2007. "Building energy performance simulation tools—a life-cycle and interoperable perspective". Working Paper. Center for Integrated Facility Engineering, Stanford University. (47 pages).
Marks, J., Andalman, B., Beardsley, P. A., Freeman, W., Gibson, S., Hodgins, J., . . . & Shieber, S. 1997. "Design galleries: A general approach to setting parameters for computer graphics and animation". In Proc. of the 24th annual conference on Computer graphics and interactive techniques.
Shah, J., Vergas-Hernandez, N., Smith, S. 2003. "Metrics for measuring ideation effectiveness". Design Studies vol. 24. 111-134.
Shneiderman, B. 1996. "The eyes have it: A task by data type taxonomy for information visualizations". In Proc. of IEEE Symposium on Visual Languages. (pp. 336-343).
Shneiderman, B., Hewett, T., Fischer, G., Jennings, P. 2006. et al. "Creativity Support Tools: Report from a US National Science Foundation Sponsored Workshop". International Journal of Human Computer Interaction, 20, 2. 61-77.
Steed, C. A., Fitzpatrick, P. J., Jankun-Kelly, T. J., Yancey, A. N., & Swan II, J. E. 2009. "An interactive parallel coordinates technique applied to a tropical cyclone climate analysis". Computers & Geosciences. (pp. 1-40).
Strauss, A. and Corbin, J. 1998. "Basics of qualitative research: Techniques and procedures for developing grounded theory". Thousand Oaks, CA: Sage. (133 pages).
Terry, M., Mynatt, E.D., Nakakoji, K., and Yamamoto, Y. 2004. "Variation in element and action: supporting simultaneous development of alternative solutions". In Proc CHI '04 (pp. 711-718).
Thibodeau, T. 2013. "U.S. makes a Top 10 supercomputer available to anyone who can 'boost' America". In www.computerworld.com.
Ward, M. O. 1994. "Xmdvtool: Integrating multiple methods for visualizing multivariate data". In Proc. of the Conference on Visulization. (9 pages).
Ward, M. O. 2002. "A taxonomy of glyph placement strategies for multidimensional data visualization". Information Visualization. (pp. 194-210).
Wegman, E. J. 1990. "Hyperdimensional data analysis using parallel coordinates". Journal of the American Statistical Association. (pp. 664-675).
Wong, P. C., & Bergeron, R. D. 1994. "30 Years of Multidimensional Multivariate Visualization". In Scientific Visualization. (pp. 1-30).
Non-Final Office Action received in U.S. Appl. No. 14/951,297, dated Dec. 9, 2019, 30 pages.
Final Office Action received in U.S. Appl. No. 14/951,310, dated Dec. 12, 2019, 39 pages.
Non-Final Office Action received in U.S. Appl. No. 14/951,338, dated Dec. 11, 2019, 32 pages.
Non-Final Office Action received in U.S. Appl. No. 14/951,366, dated Nov. 12, 2019, 23 pages.

(56) References Cited

OTHER PUBLICATIONS

Final Office Action received for U.S. Appl. No. 14/951,297, dated Apr. 22, 2020, 17 pages.

* cited by examiner

TECHNIQUE FOR GENERATING APPROXIMATE DESIGN SOLUTIONS

CROSS-REFERENCE TO RELATED APPLICATIONS

This application claims the benefit of United States provisional patent application titled "Dreamcatcher: Approaches for Design Variation," filed on Nov. 25, 2014 and having Ser. No. 62/084,490. The subject matter of this related application is hereby incorporated herein by reference.

BACKGROUND OF THE INVENTION

Field of the Invention

Embodiments of the present invention relate generally to engineering design and, more specifically, to a technique for generating approximate design solutions.

Description of the Related Art

In a conventional engineering workflow, an engineer uses a computer-aided design (CAD) tool to generate geometry that solves a design problem. In doing so, the end-user may rely on various cloud-based services to perform computationally intensive tasks. For example, the end-user may perform a finite-element analysis (FEM) of a mechanical design using a cloud-based computer configured for performing FEM analysis. Cloud-based services are generally not free; thus, the end-user must expend capital resources to use those resources to perform processing tasks.

One significant drawback of the cloud-based service model is that conventional CAD tools and cloud-based services alike provide no mechanisms for verifying that a task to be performed within the cloud is actually error-free and ready to be processed. Thus, the end-user may submit a task to a cloud-based service, only to discover later that a flaw existed in the task. In such a scenario, the results generated by the cloud-based service may be correspondingly flawed and unusable. Worse, the end-user must spend capital regardless of whether the task submitted for processing is flawed and regardless of whether the results can be used.

As the foregoing illustrates, what is needed in the art is a more effective approach for verifying processing tasks prior to execution.

SUMMARY OF THE INVENTION

Various embodiments of the present invention sets forth a non-transitory computer-readable medium storing instructions that, when executed by a processor, cause the processor to generate an approximate solution to a design problem, by performing the steps of generating design problem geometry associated with a design problem, synthesizing a problem specification based on the design problem geometry and a set of design criteria, determining that the problem specification satisfies minimum input requirements for a solution engine resident within a client computing device, and executing the solution engine to generate an approximate solution to the design problem, where the approximate solution includes a range of possible design solutions.

At least one advantage of the disclosed approach is that it allows an end-user to review and verify an approximate rendering of potential design solutions before causing a computationally intensive, and possibly expensive, rendering of design solutions to take place.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details.

Figure 1:
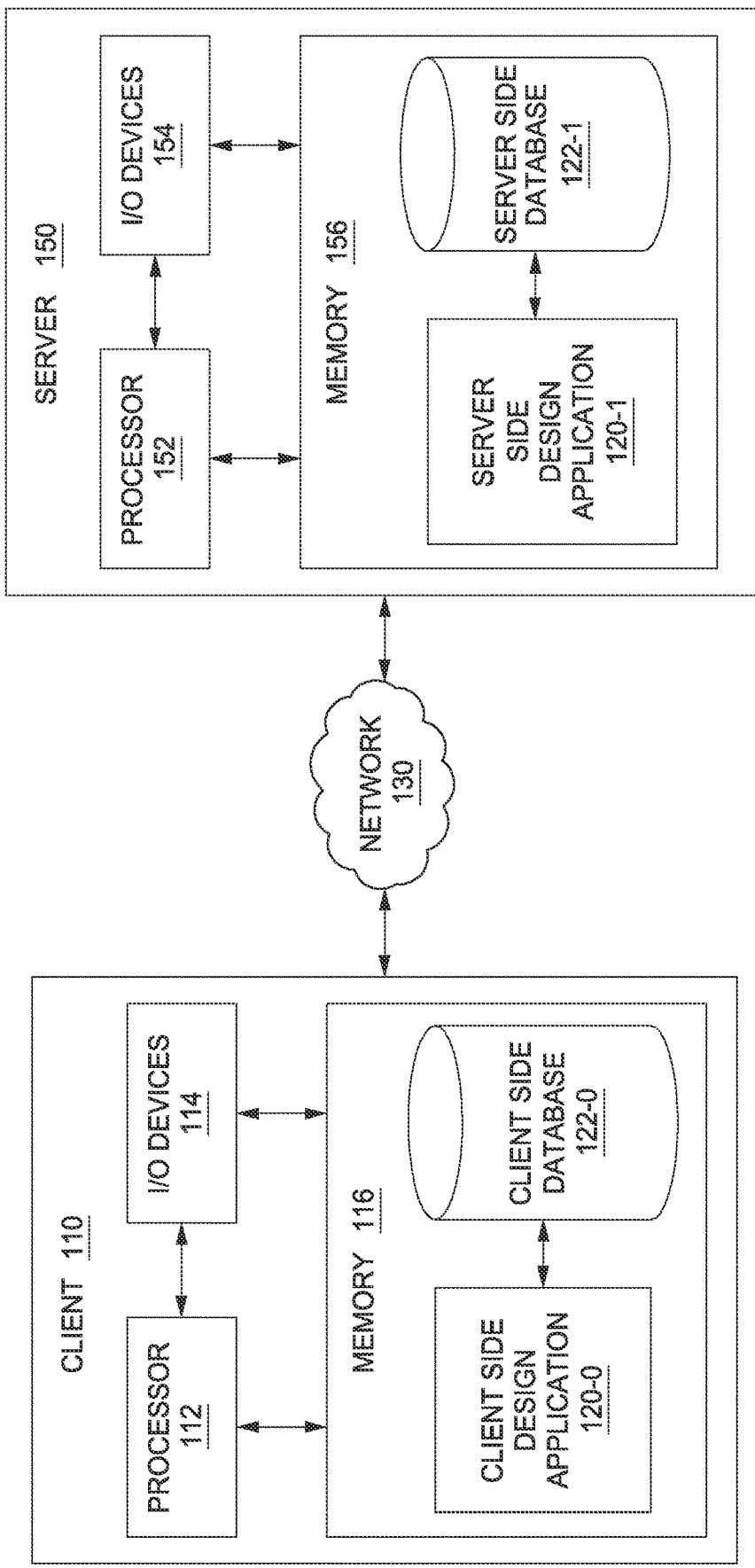
FIG. 1 illustrates a system configured to implement one or more aspects of the present invention.

FIG. 1 illustrates a system 100 configured to implement one or more aspects of the present invention. As shown, system 100 includes, without limitation, a client 110 coupled via a network 130 to a server 150. Client 110 may be any technically feasible variety of client computing device, including a desktop computer, laptop computer, mobile device, and so forth. Network 150 may be any technically feasible set of interconnected communication links, including a local area network (LAN), wide area network (WAN), the World Wide Web, or the Internet, among others. Server 150 may be any technically feasible type of server computing device, including a remote virtualized instance of a computing device, one or more physical cloud-based computing devices, a portion of a datacenter, and so forth.

Client 110 includes processor 112, input/output (I/O) devices 114, and memory 116, coupled together. Processor 112 may be any technically feasible form of processing device configured process data and execute program code.

Processor 112 could be, for example, a central processing unit (CPU), a graphics processing unit (GPU), an application-specific integrated circuit (ASIC), a field-programmable gate array (FPGA), and so forth. I/O devices 114 may include devices configured to receive input, including, for example, a keyboard, a mouse, and so forth. I/O devices 114 may also include devices configured to provide output, including, for example, a display device, a speaker, and so forth. I/O devices 114 may further include devices configured to both receive and provide input and output, respectively, including, for example, a touchscreen, a universal serial bus (USB) port, and so forth.

Memory 116 may be any technically feasible storage medium configured to store data and software applications. Memory 116 could be, for example, a hard disk, a random access memory (RAM) module, a read-only memory (ROM), and so forth. Memory 116 includes client-side design application 120-0 and client-side database 122-0. Client-side design application 120-0 is a software application that, when executed by processor 112, causes processor 112 to generate an approximate solution to a design problem. In doing so, client-side design application 120-0 may store and update data within client-side database 122-0. Such operations may be implemented via computer-aided design (CAD) tools provided by client-side design application 120-0, or via tools provided by other software applications. Client-side design application 120-0 may also interoperate with a corresponding design application that resides within server 150, and access a database that also resides on server 150, as described in greater detail below.

Server 150 includes processor 152, I/O devices 154, and memory 156, coupled together. Processor 152 may be any technically feasible form of processing device configured process data and execute program code, including a CPU, a GPU, an ASIC, an FPGA, and so forth. I/O devices 114 may include devices configured to receive input, devices configured to provide output, and devices configured to both receive and provide input and output.

Memory 156 may be any technically feasible storage medium configured to store data and software applications, including a hard disk, a RAM module, a ROM, and so forth. Memory 156 includes server-side tracking engine 120-1 and server-side design space database 122-1. Server-side design application 120-1 is a software application that, when executed by processor 152, causes processor 152 generate a spectrum of solutions to a design problem. In doing so, server-side design application 120-1 may store and update data within server-side database 122-1. Such operations may be implemented via CAD tools provided by server-side design application 120-1 or other types of tools. Server-side design application 120-0 may also interoperate with client-side design application 120-0, and access database 122-0.

In operation, client-side design application 120-0 executes a client-side solver to generate an approximate solution to a design problem specified by an end-user. The client-side solver is configured to prioritize speed over accuracy when generating the approximate solution. Based on the approximate solution, the end-user may update various data that reflects the design problem. Then, the end-user may cause server-side design application 120-1 to execute a server-side solver to generate a spectrum of design solutions. The server-side solver is configured to prioritize accuracy and quantity of design solutions over speed. Client-side design application 120-0 and server side design application 120-1 are described in greater detail below in conjunction with FIG. 2.

Figure 2:
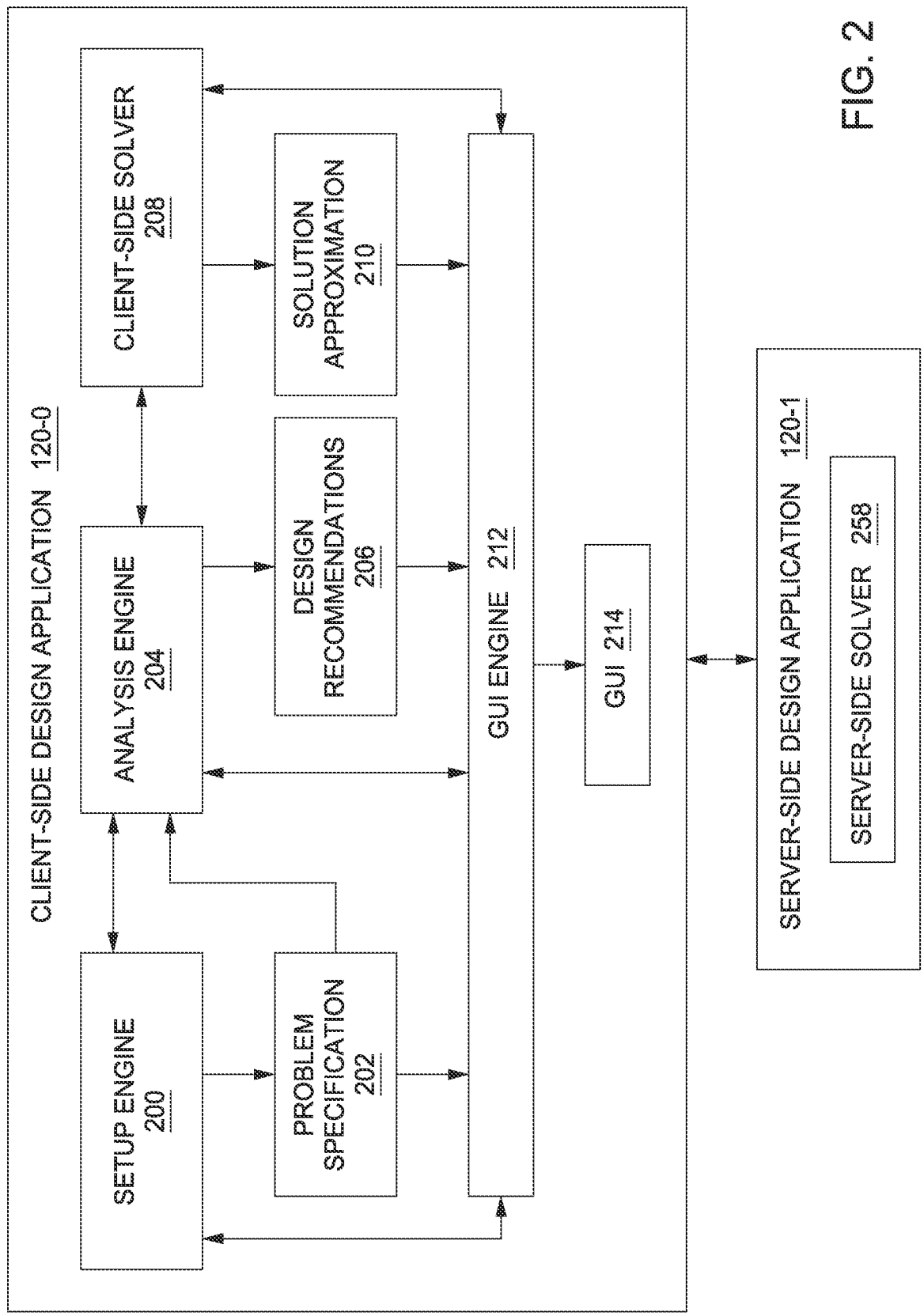
FIG. 2 is a more detailed illustration of the client-side and server-side design applications of FIG. 1, according to various embodiments of the present invention.

FIG. 2 is a more detailed illustration of the client-side and server-side design applications of FIG. 1, according to various embodiments of the present invention. As shown, client-side design application 120-0 includes, without limitations, a setup engine 200, a problem specification 202, an analysis engine 204, design recommendations 206, a client-side solver 208, a solution approximation 210, a graphical user interface (GUI) engine 212, and a GUI 214. As also shown, server-side design application 120-1 includes, without limitation, a server-side solver 258.

Setup engine 200 is configured to generate problem specification 202. Analysis engine 204 is configured to generate design recommendations 206. Client-side solver 208 is a solution engine that is configured to generate solution approximation 210. GUI engine 212 is configured to generate GUI 214. GUI 214 may include graphical representations of problem specification 202, design recommendations 206, and/or solutions approximation 210. An end-user may interact with setup engine 200, analysis engine 204, client-side solver 208 and GUI engine 212 via GUI 214.

Setup engine 200 provides various tools that allow the end-user to define a design problem to be solved within a simulated three-dimensional (3D) environment. The end-user may interact with setup engine 200, via GUI 214, to define design problem geometry, design objectives, design constraints, boundary conditions, and other data associated with the design problem. This data may inform the process of creating solutions to the design problem. An example of this process is described below in conjunction with FIGS. 3-5. Based on interactions with the end-user, setup engine 200 generates problem specification 202.

Problem specification 202 is a data structure that embodies all of the design problem information received via interactions with the end-user. For example, problem specification 202 could reflect a 3D environment that includes specific locations where certain forces are to be supported, within precise volumetric constraints, under particular weight limitations.

Analysis engine 204 is configured to process problem specification 202 to determine whether the design problem outlined in that specification is sufficiently well defined to allow a multi-objective solver included in client-side solver 208 to generate design solutions for that design problem. For example, analysis engine 204 could analyze problem specification 202 to determine whether all portions of the design problem geometry are fully constrained. In another example, analysis engine 204 could analyze problem specification 202 to determine whether problem specification 204 includes a threshold number of design constraints.

In one embodiment, analysis engine 204 executes a function that queries problem specification 202 periodically to test for a set of attributes needed prior to submission of that specification to server 150 for processing. In doing so, analysis engine 204 determines whether a threshold set of design constraints are met. Analysis engine 204 also determines whether a set of goals is met (e.g., loading criteria, fluid flow criteria, thermal criteria, geometric criteria, etc.). Analysis engine 204 queries problem specification 202 to determine whether sufficient constraints and goals are present. When problem specification 202 has been completed to the threshold level, the end-user is notified that the problem specification 202 is ready to be submitted to server 150 and the ability to generate and display approximate design solution 210 is enabled.

As a general matter, analysis engine 204 identifies the minimum input requirements of client-side solver 208, and then determines whether problem specification 202 provides those minimum input requirements. If problem specification 202 does not include sufficient data, then analysis engine 204 generates design recommendations 206 and displays those recommendations via GUI engine 212. Design recommendations 206 include suggested changes to problem specification 202 that, if applied, would cause problem specification 204 to reach the minimum input input requirements of client-side solver 208. The end-user may accept those recommendations and/or continue editing problem specification 202 until analysis engine 204 identifies that the minimum input requirements have been met.

When problem specification 202 finally includes sufficient information, then client-side solver 208 executes the multi-objective solver mentioned to generate a set of design solutions that potentially solve the design problem associated with problem specification 202. Client-side solver 208 generally implements a coarse solution strategy that favors speed over accuracy. Therefore, the various design solutions generated by client-side solver 208 may not optimally solve the design problem. However, the range of design solutions generated in this fashion may be used to illustrate to the end-user an approximation of a design solution that could be generated via a finer and more accurate solution strategy.

More specifically, client-side solver 208 combines the set of design solutions generated via execution of the multi-objective solver in order to create solution approximation 210. Solution approximation 210 is a composite of two or more design solutions. GUI engine 212 then renders solution approximation 210 within the 3D environment associated with problem specification 202. An exemplary solution approximation is described below in conjunction with FIG. 6. Based on solution approximation 210, the end-user may identify regions of the design geometry in need of modification, additional design constraints, further design objectives, and so forth. Then, the end-user may make any needed changes, as also described below in conjunction with FIG. 7.

Once the end-user is satisfied with problem specification, the end-user may initiate computation of design solutions via server-side solver 258 within server-side design application 120-1. Server-side solver 258 is a solution engine configured to execute a multi-objective solver that implements a much finer and more accurate solution strategy than client-side solver 208. Server-side solver 258 may implement a similar multi-objective solver as client-side solver 208, however, server-side solver 258 performs vastly more computationally intensive operations to generate design solutions compared to client-side solver 208.

For example, client-side solver 208 could execute a topology generation algorithm using 1000 grid cells, while server-side solver could execute a similar topology generation algorithm using 100,000,000 grid cells. In another example, client-side solver 208 could execute a numerical simulation that performs only 10 iterations, while server-side solver could execute a similar numerical simulation that performs 1,000,000 iterations.

Generally, server-side solver 258 executes in a computational environment that offers computational resources that exceed those available to client-side solve 208. Usage of those resources may require the end-user to expend capital. Accordingly, the end-user may wish to finalize problem specification 202 before submitting that problem specification to server-side solver 258 for processing, thereby avoiding the unnecessary expenditure of capital. To support this goal, client-side solver 208 allows the end-user review solution approximation 210, in advance of submitting problem specification 202 to server-side solver 258, to identify omissions, correct mistakes, and so forth. This approach may make the design process more efficient and allow more robust problem specifications, with potentially fewer errors, to be submitted for processing.

The general techniques described thus far may be applied in order to generate problem specifications and solutions approximations for a wide range of different design problems. These techniques are described in greater detail below, in the context of a specific example, in conjunction with FIGS. 3-8. Persons skilled in the art will understand that the example described below is meant for illustrative purposes only and not meant to be limiting.

Figure 3:
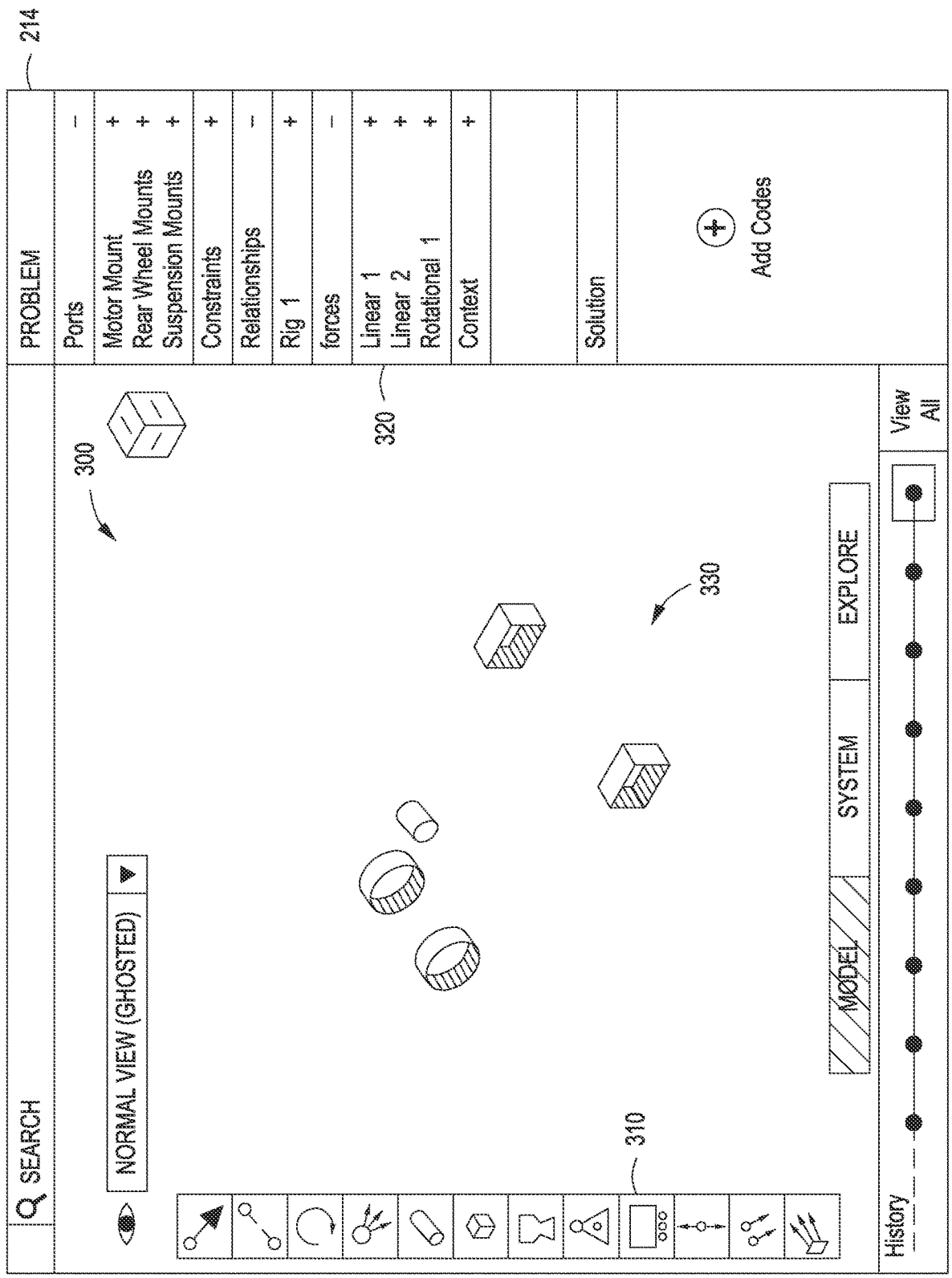
FIG. 3 illustrates design problem geometry generated via the setup engine of FIG. 2, according to various embodiments of the present invention.

FIG. 3 illustrates design problem geometry that is generated via the setup engine of FIG. 2, according to various embodiments of the present invention. As shown, GUI 214 includes, without limitation, a design space 300, a toolbar 310, and a data panel 320.

Design space 300 generally corresponds to problem specification 202. Design space 300 includes a 3D environment where an end-user generates design problem geometry 330. Design problem geometry 330 represents specific boundary conditions and/or bounding geometry associated with a design problem. Toolbar 310 provides tools that the end-user may manipulate in order to generate design problem geometry 330. Data panel 320 includes information associated with design problem geometry 330, including various geometrical and/or physical attributes of design problem geometry 330.

In operation, GUI engine 212 receives end-user input, via one or more of the tools included in toolbar 310, which describe design problem geometry 330. As the end-user modifies design space 300, setup engine 200 updates problem specification 202 to reflect design space 300. Then, analysis engine 204 analyzes problem specification 202 and provides a reference geometry that may assist the end-user with completing design problem geometry 330, as described in greater detail below in conjunction with FIG. 4.

Figure 4:
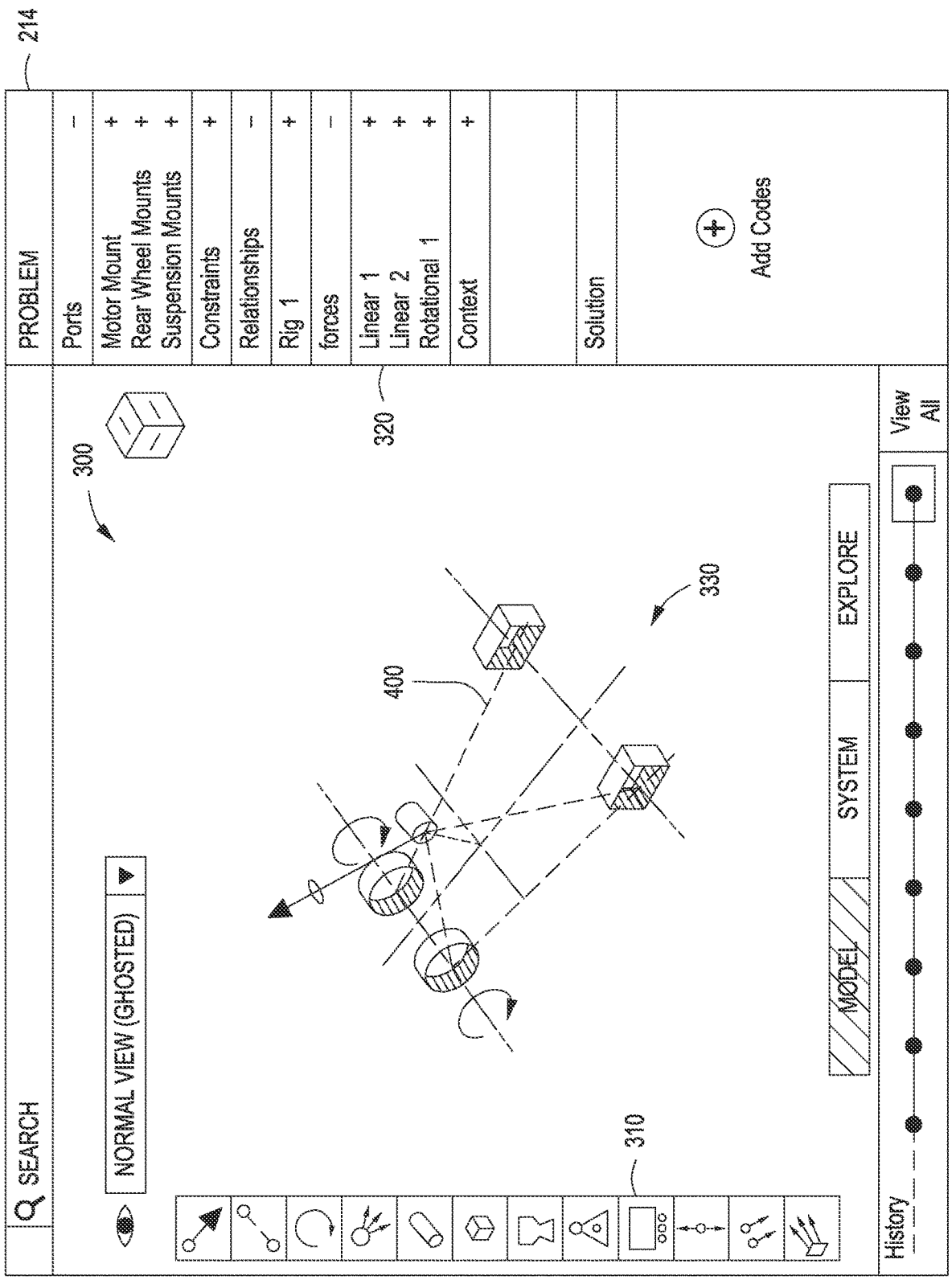
FIG. 4 illustrates reference geometry generated via the analysis engine of FIG. 2 and associated with the design problem geometry of FIG. 3, according to various embodiments of the present invention.

FIG. 4 illustrates reference geometry generated via the analysis engine of FIG. 2 and associated with the design problem geometry of FIG. 3, according to various embodiments of the present invention. As shown, design space 300 includes, without limitation, reference geometry 400 that represents a skeleton of a potentially feasible design solution. Analysis engine 204 is configured to analyze design space geometry 330, as the geometry evolves based on end-user input, to determine potentially similar approaches to solving the design problem associated with that geometry.

For example, analysis engine 204 could analyze the physical organization of boundary conditions associated with design space geometry 330 to identify (e.g., within a database) existing design solutions for similarly organized boundary conditions. Then, analysis engine 204 could generate reference geometry 400 based on those solutions, and adapt that geometry to fit within design space geometry 330. In one embodiment, reference geometry 400 is "geometrically similar" to design problem geometry 330. In the context of this disclosure, geometrically similar constructs have at least one point, at least one line segment, at least one junction between line segments, at least one arc, at least one surface, or at least one junction between surfaces in common with one another. Reference geometry 400 provides sample locations where the end-user may apply design objectives and/or design constraints, including forces that should be balanced by feasible design solutions, as described in greater detail below in conjunction with FIG. 5.

Figure 5:
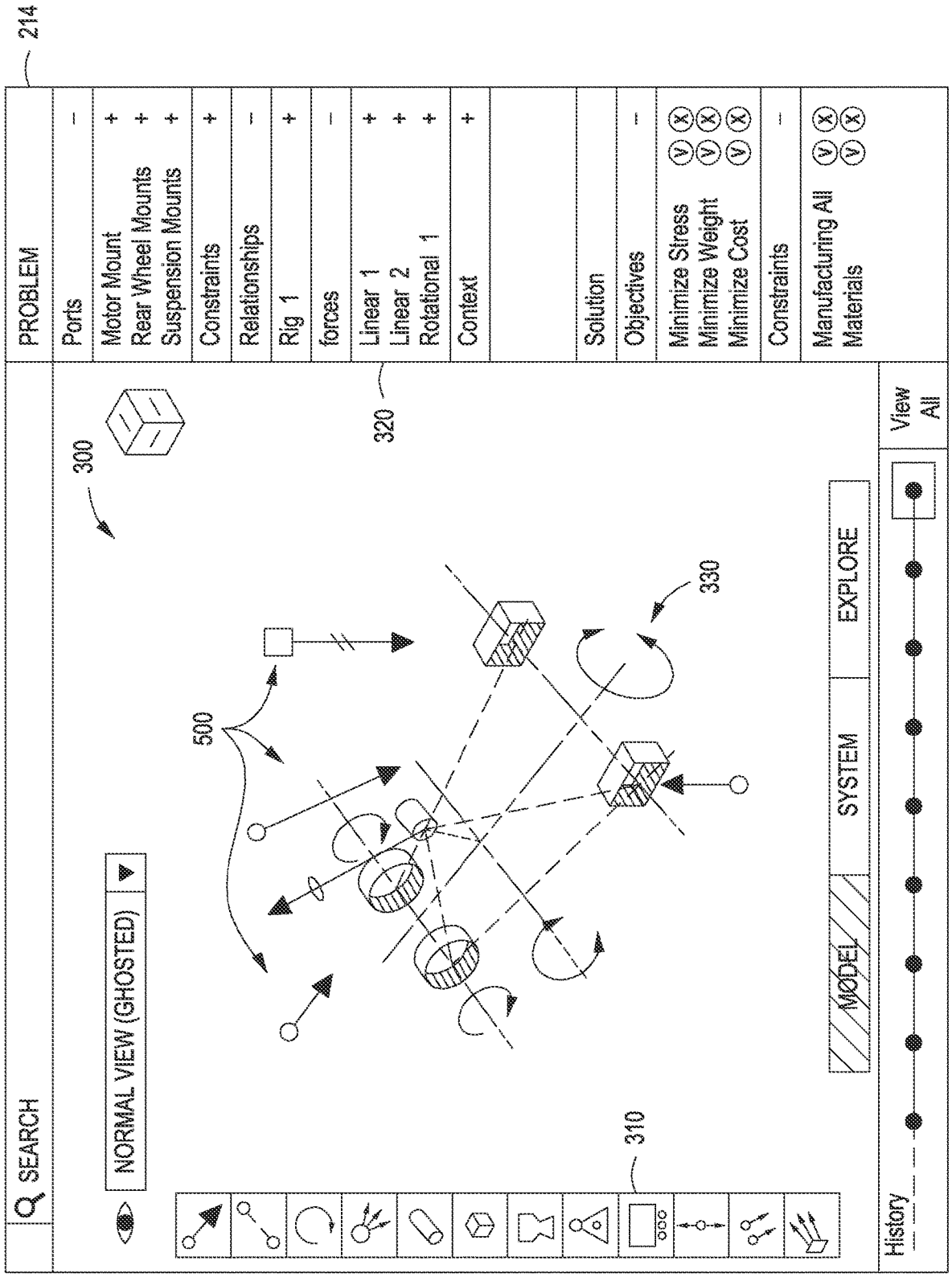
FIG. 5 illustrates a set of forces generated via the setup engine of FIG. 2 and associated with the design problem geometry of FIG. 3, according to various embodiments of the present invention.

FIG. 5 illustrates a set of forces generated via the setup engine of FIG. 2 and associated with the design problem geometry of FIG. 3, according to various embodiments of the present invention. As shown, GUI 214 includes, without limitation, a set of forces 500 associated with design problem geometry 330. The end-user may define forces 500 via tools provided in toolbar 310. Each force 500 may represent a force applied to a specific location on design problem geometry 330, a force applied to a specific location on reference geometry 400, or a force applied to a location proximate to design problem geometry 330. Generally, forces 500 are to be balanced by a feasible design solution. Thus, forces 500 represent one form of design objective. The end-user may also add constraints to design geometry 330 via interactions with GUI 214, including geometric constraints, physical constraints, manufacturing constraints, and so forth.

As the end-user generates design problem geometry, adds design objectives and/or design constraints, and generally fleshes out design space 300, setup engine 202 updates problem specification 202, as mentioned above. With each change made to problem specification 202, analysis engine 204 analyzes design space 300, design problem geometry 330, and other data within that problem specification to determine whether sufficient information exists to generate at least a coarse design solution that roughly approximates a feasible design solution.

As discussed above in conjunction with FIG. 2, analysis engine 204 may identify the minimum input requirements of client-side solver 208, and then determine whether problem specification 202 provides those minimum input requirements. When problem specification 202 includes sufficient information, client-side solver 208 executes the multi-objective solver to generate a set of design solutions, then combines those potentially solutions to generate solution approximation 210, as described in greater detail below in conjunction with FIG. 6.

Figure 6:
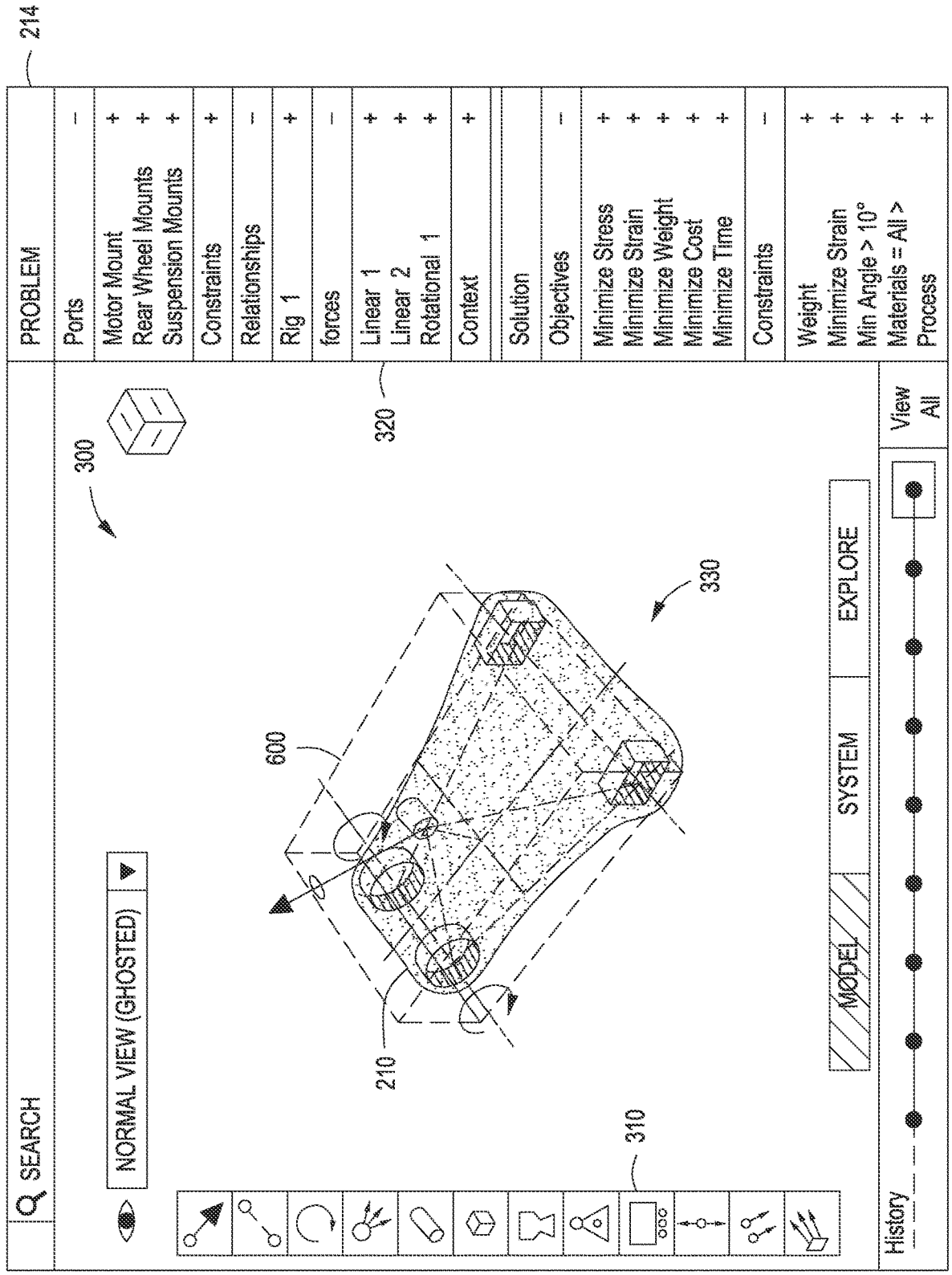
FIG. 6 illustrates an approximate solution to the design problem generated via the client-side solver of FIG. 2, according to various embodiments of the present invention.

FIG. 6 illustrates an approximate solution to the design problem generated via the client-side solver of FIG. 2, according to various embodiments of the present invention. As shown, GUI 214 includes, without limitation, solution approximation 210 enclosed by a bounding box 600. Solution approximation 210 represents a "fuzzy" version of a range of potentially feasible design solutions. Solution approximation 210, as mentioned above, may be generated based on a small collection of design solutions, generated using a solution strategy that favors speed over accuracy. Thus, solution approximation 210 may not fully meet all design objectives and/or design constraints. However, solution approximation 210 provides the end-user with a rough view of the topology of potential design solutions. In the example shown in FIG. 6, solution approximation 210 includes geometry in a region of design problem geometry 330 where other geometry needs to reside. The end-user may observe this issue and then take corrective action, as described in greater detail below in conjunction with FIG. 7.

Figure 7:
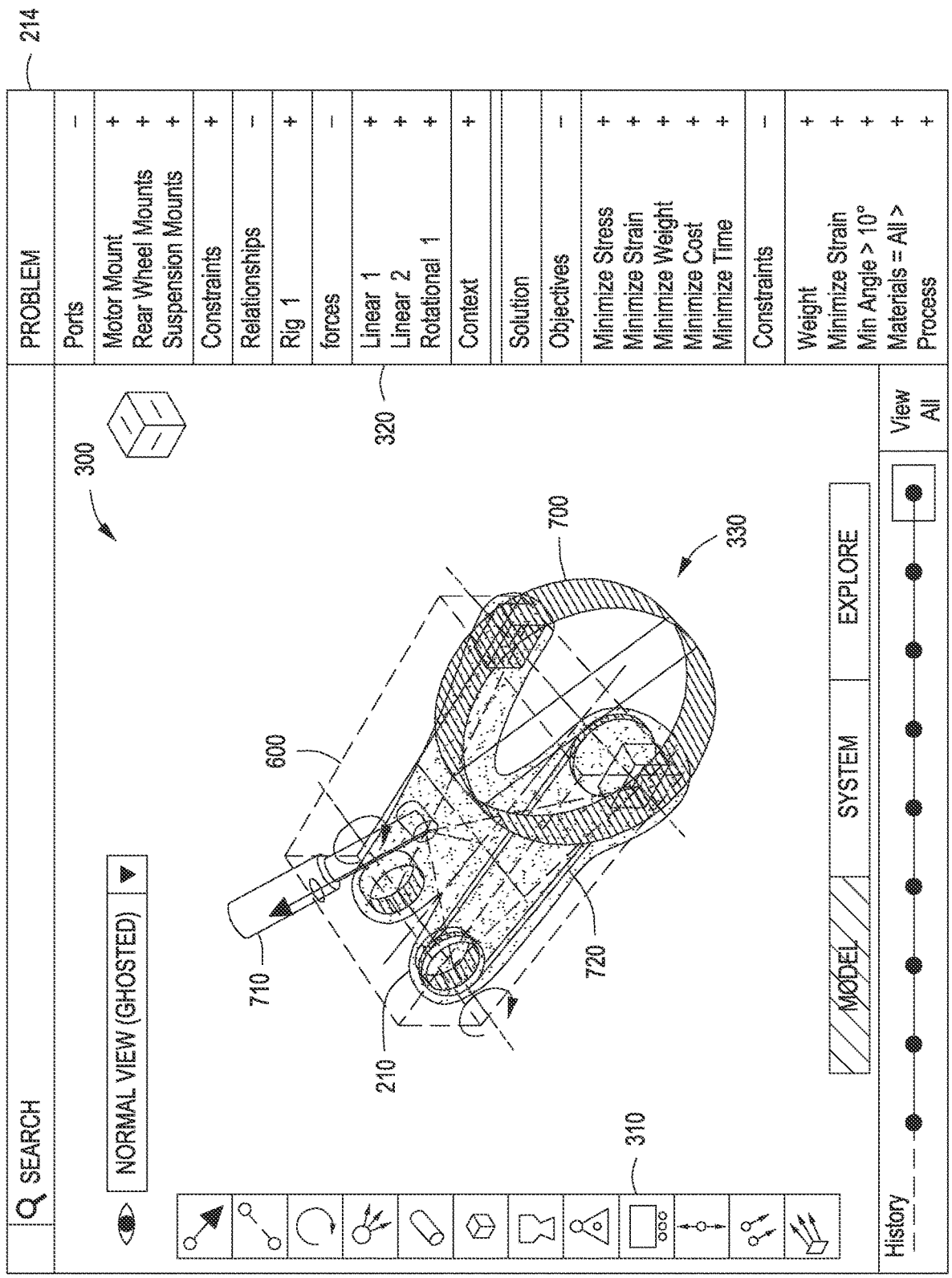
FIG. 7 illustrates additional constraints added to the approximate solution to the design problem via the setup engine of FIG. 2, according to various embodiments of the present invention.

FIG. 7 illustrates additional constraints added to the approximate solution to the design problem via the setup engine of FIG. 2, according to various embodiments of the present invention. As shown, GUI 214 includes, without limitation, a wheel 700, a shock mount 710, and a chain 720. These components represent additional geometry that needs to be added to design space 300 as design constraints to indicate that design solutions should not include geometry within the volumes of those components. The end-user may add wheel 700, shock mount 710, and chain 720 in order to further constrain problem specification 202. Analysis engine 204 may then analyze problem specification 202 and update solution approximation 210 and provide details regarding that updated solution approximation, as described in greater detail below in conjunction with FIG. 8.

Figure 8:
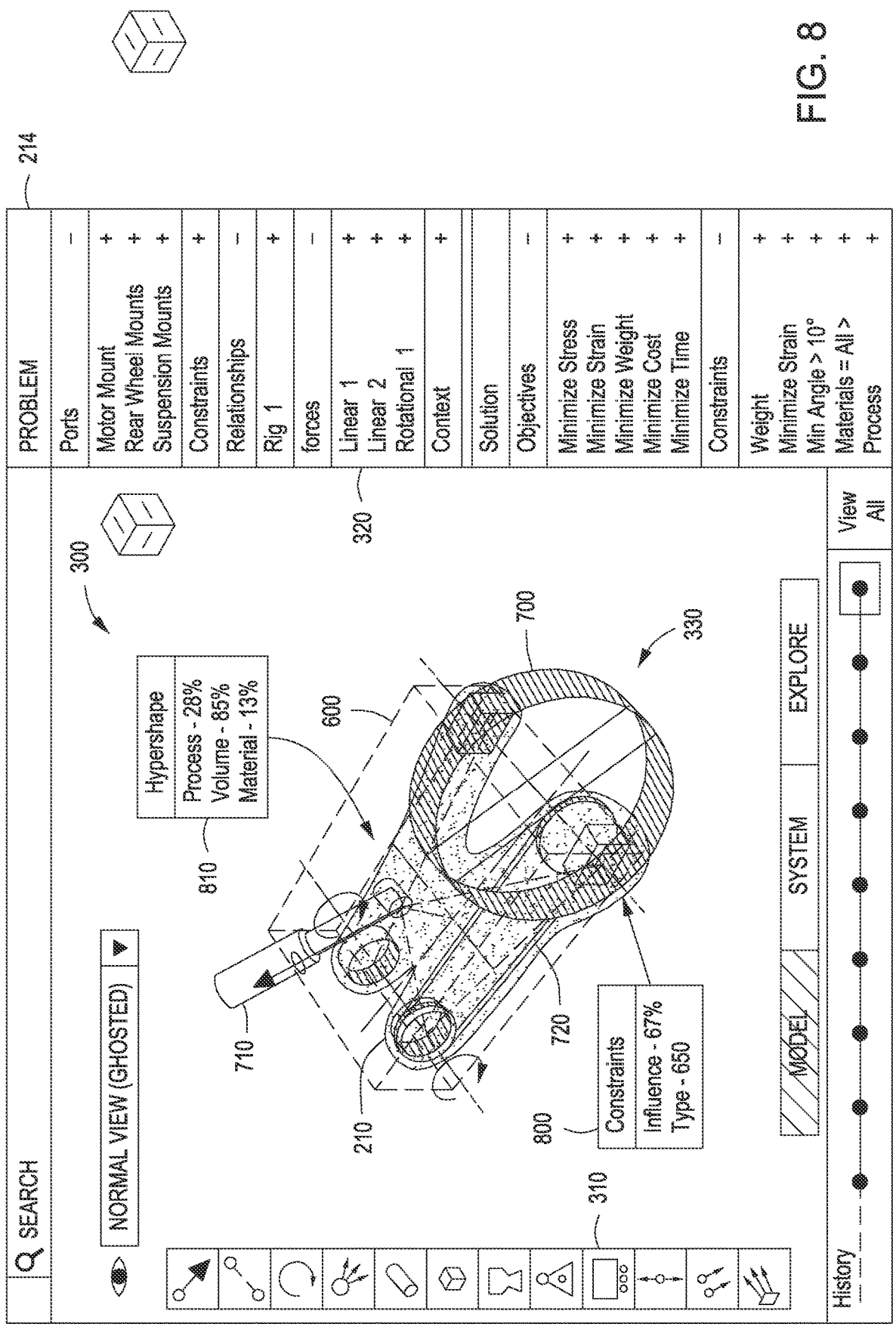
FIG. 8 illustrates various data added to the approximate solution to the design problem via the analysis engine of FIG. 2, according to various embodiments of the present invention.

FIG. 8 illustrates various data added to the approximate solution to the design problem via the analysis engine of FIG. 2, according to various embodiments of the present invention. As shown, GUI 214 includes, without limitation, constraint popup 800 and variability popup 810. Constrain popup 800 provides the end-user with various data related to the constraint associated with wheel 700. Variability popup 810 provides information that reflects variations across all design solutions associated with solution approximation 810. This data could include process variation, volume variation, and material usage variation.

Once the end-user is satisfied with problem specification, the end-user may initiate computation of design solutions via server-side solver 258 within server-side design application 120-1. As mentioned, usage of server-side solver 258 may require the end-user to expend capital. Thus, providing the end-user with solution approximation 210 in the manner discussed herein, thereby allowing the end-user to correct omissions, mistakes, may prevent the end-user from expending capital to generate design solutions based on a flawed problem specification 202.

Referring generally to FIGS. 3-8, persons skilled in the art will understand that theses figures are provided for illustrative purposes only and not meant to be limiting. The basic techniques described thus far are described in generic fashion below in conjunction with FIG. 9.

Figure 9:
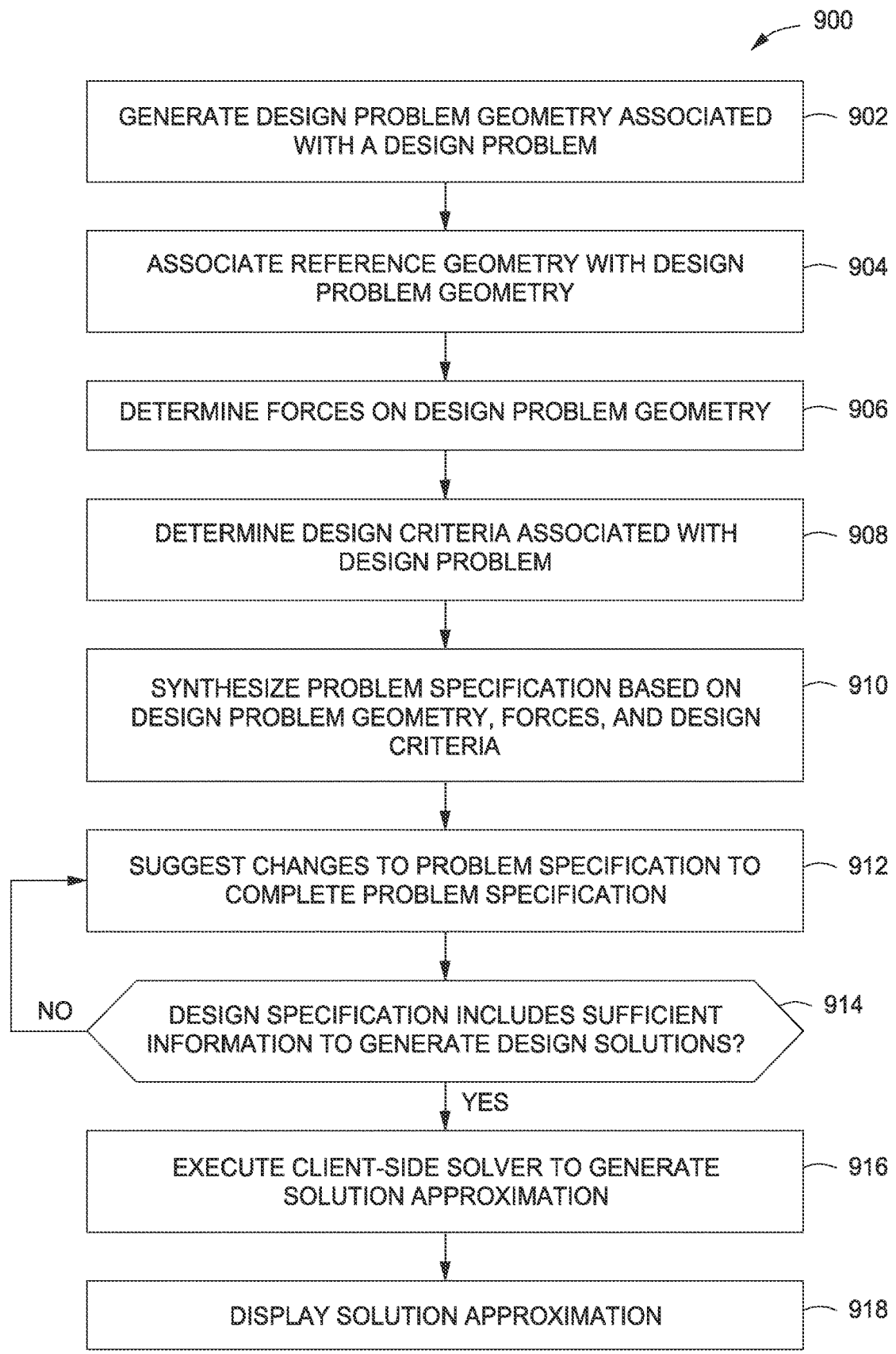
FIG. 9 is a flow diagram of method steps for generating an approximate solution to a design problem, according to various embodiments of the present invention.

FIG. 9 is a flow diagram of method steps for generating an approximate solution to a design problem, according to various embodiments of the present invention. Although the method steps are described in conjunction with the systems of FIGS. 1-8, persons skilled in the art will understand that any system configured to perform the method steps, in any order, is within the scope of the present invention.

As shown, a method 900 begins at step 902, where setup engine 200 generates design problem geometry 330 in response to end-user interactions with GUI 214. Design problem geometry 330 represents specific boundary conditions and/or bounding geometry associated with a design problem. As the end-user modifies design space 300, where design problem geometry 330 resides, setup engine 200 updates problem specification 202 to reflect design space 300.

At step 904, analysis engine 204 associates reference geometry 400 with design problem geometry 330. In doing so, analysis engine 204 analyzes design space geometry 330 to determine potentially similar approaches to solving the design problem associated with that geometry. For example, analysis engine 204 could analyze the physical organization of boundary conditions associated with design space geometry 330 to identify (e.g., within a database) existing design solutions for similarly organized boundary conditions. Then, analysis engine 204 could generate reference geometry 400 based on those solutions, and adapt that geometry to fit within design space geometry 330.

At step 906, setup engine 200 determines a set of forces on design problem geometry 330 and/or reference geometry 400. The end-user may define the set of forces via tools provided in toolbar 310. Generally, each force in the set of forces is to be balanced by a feasible design solution. Thus, the set of forces represents one form of design objective.

At step 908, setup engine 200 determines design criteria associated with the design problem set forth in problem specification 202. The end-user may add design objectives, such as the set of forces described in conjunction with step 906, add design constraints, include additional boundary conditions, and generally add any manner of design criteria in order to flesh out the design problem.

At step 910, setup engine 200 synthesizes (or updates) problem specification 202 to include all such design criteria. With each change made to problem specification 202, analysis engine 204 analyzes design space 300, design problem geometry 330, and other data within that problem specification to determine changes to design space 300 that would assist with completing design specification 202.

At step 912, analysis engine 204 may suggest to the end-user changes to design space 300 that would increase the level of completeness of problem specification 202. For example, analysis engine 204 could suggest to the end-user that a specification geometrical constraint be removed so that the design problem is not overly constrained.

At step 914, analysis engine 204 determines whether sufficient information exists within problem specification 202 to generate at least a coarse design solution that roughly approximates a feasible design solution. For example, analysis engine 204 could analyze problem specification 202 to determine whether all portions of the design problem geometry are fully constrained. More generally, analysis engine 204 identifies the minimum input requirements of client-side solver 208, and then determines whether problem specification 202 provides those minimum input requirements. If problem specification 202 does not include sufficient information, then the method 900 returns to step 912 and proceeds as described above. Otherwise, the method 900 proceeds to step 916.

At step 916, client-side solver 208 generates solution approximation 210. In performing step 916, client-side solver executes the multi-objective solver mentioned previously to generate a set of design solutions that potentially solve the design problem associated with problem specification 202. Client-side solver 208 then generates a composite of those design problems to arrive at solution approximation 210. Again, solution approximation 210 represents a "fuzzy" version of a range of potentially feasible design solutions.

At step 918, GUI engine 212 updates GUI 214 to include solution approximation 210. GUI engine 212 may also populate GUI 214 with various data associated with solution approximation 210, including constraint information as well as data that reflects variability across design solutions within solution approximation 210.

In sum, a design application interacts with an end-user to generate design problem geometry that reflects a design problem to be solved. Various design objectives, design constraints, boundary conditions, and other design criteria may be associated with the design problem geometry via the design application. When the design problem is sufficiently well defined, a client-side solver generates a solution approximation using a coarse multi-objective solver. The client-side solver favors speed over accuracy, and so the solution approximation provides only a rough representation of various attributes of potentially feasible design solutions. Based on the solution approximation, the end-user may correct any omissions, mistakes, and so forth, before executing pay-per-service cloud-based parallel solver.

At least one advantage of the disclosed approach is that it allows an end-user to review and verify an approximate rendering of potential design solutions before causing a computationally intensive, and possibly expensive, rendering of design solutions to take place. Thus, the end-user may avoid expending time and other resources until a design problem is fully specified and verified, thereby making the design process substantially more efficient.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable processors or gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

The invention claimed is:

1. One or more non-transitory computer-readable media storing instructions that, when executed by one or more processors, cause the one or more processors to generate an approximate solution to a design problem, by performing the steps of:
   generating design problem geometry associated with a design problem;
   synthesizing a problem specification based on the design problem geometry and a set of design criteria;
   determining that the problem specification satisfies minimum input requirements for a first solution engine resident within a client computing device;
   executing the first solution engine to generate an approximate solution to the problem specification, wherein the approximate solution includes a first set of design solutions;
   displaying, via a graphical user interface (GUI), the approximate solution; and
   after displaying the approximate solution, transmitting the problem specification to a second solution engine resident within a server machine to generate a second set of design solutions, wherein the second solution engine expends greater computational resources to generate design solutions than the first solution engine.

2. The one or more non-transitory computer-readable media of claim 1, wherein generating the design problem geometry comprises receiving at least one input indicating at least one location on the design problem geometry where a force is to be applied.

3. The one or more non-transitory computer-readable media of claim 1, further comprising:
   identifying reference geometry that is geometrically similar to the design problem geometry; and
   associating the reference geometry with the design problem geometry.

4. The one or more non-transitory computer-readable media of claim 3, further comprising determining at least one force associated with a design constraint that is applied to the reference geometry.

5. The one or more non-transitory computer-readable media of claim 1, wherein the set of design criteria includes at least one of a design objective, a design constraint, and a boundary condition.

6. The one or more non-transitory computer-readable media of claim 1, further comprising:
   determining that a first version of the problem specification does not satisfy the minimum input requirements for the solution engine;
   determining a modification to the first version of the problem specification that would cause the problem specification to satisfy the minimum input requirements for the solution engine; and
   incorporating the modification into the first version of the problem specification to generate a problem specification that satisfies the minimum input requirements for the solution engine.

7. The one or more non-transitory computer-readable media of claim 1, wherein each possible design solution associated with the approximate solution partially meets the set of design criteria.

8. The one or more non-transitory computer-readable media of claim 1, wherein each design solution included in the second set of design solutions meets the set of design criteria.

9. The one or more non-transitory computer-readable media of claim 8, wherein the second solution engine resident within the server machine generates design solutions having greater accuracy than the design solutions generated by the first solution engine resident within the client computing device.

10. The one or more non-transitory computer-readable media of claim 8, wherein the first solution engine resident within the client computing device generates possible design solutions with greater speed than the second solution engine resident within the server machine generates design solutions.

11. A computer-implemented method for generating an approximate solution to a design problem, the method comprising:
    generating design problem geometry associated with a design problem;
    synthesizing a problem specification based on the design problem geometry and a set of design criteria;
    determining that the problem specification satisfies minimum input requirements for a first solution engine resident within a client computing device;
    executing the first solution engine to generate an approximate solution to the problem specification, wherein the approximate solution includes a first set of design solutions;
    displaying, via a graphical user interface (GUI), the approximate solution; and
    after displaying the approximate solution, transmitting the problem specification to a second solution engine resident within a server machine to generate a second set of design solutions, wherein the second solution engine expends greater computational resources to generate design solutions than the first solution engine.

12. The computer-implemented method of claim 11, wherein generating the design problem geometry comprises receiving at least one input indicating at least one location on the design problem geometry where a force is to be applied.

13. The computer-implemented method of claim 11, further comprising:
    identifying reference geometry that is geometrically similar to the design problem geometry; and
    associating the reference geometry with the design problem geometry.

14. The computer-implemented method of claim 13, further comprising determining at least one force associated with a design constraint that is applied to the reference geometry.

15. The computer-implemented method of claim 11, wherein the set of design criteria includes at least one of a design objective, a design constraint, and a boundary condition.

16. The computer-implemented method of claim 11, further comprising:
- determining that a first version of the problem specification does not satisfy the minimum input requirements for the solution engine;
- determining a modification to the first version of the problem specification that would cause the problem specification to satisfy the minimum input requirements for the solution engine; and
- incorporating the modification into the first version of the problem specification to generate a problem specification that satisfies the minimum input requirements for the solution engine.

17. The computer-implemented method of claim 11, wherein each possible design solution associated with the approximate solution partially meets the set of design criteria.

18. The computer-implemented method of claim 11, wherein each design solution included in the second set of design solutions meets the set of design criteria.

19. The computer-implemented method of claim 18, wherein the second solution engine resident within the server machine generates design solutions having greater accuracy than the possible design solutions generated by the first solution engine resident within the client computing device.

20. The computer-implemented method of claim 18, wherein the first solution engine resident within the client computing device generates possible design solutions with greater speed than the second solution engine resident within the server machine generates design solutions.

21. A system configured to generate an approximate solution to a design problem, comprising:
- a memory storing a design application; and
- a processor that, when executing the design application, is configured to:
  - generate design problem geometry associated with a design problem;
  - synthesize a problem specification based on the design problem geometry and a set of design criteria;
  - determine that the problem specification satisfies minimum input requirements for a first solution engine resident within the memory;
  - execute the first solution engine to generate an approximate solution to the problem specification, wherein the approximate solution includes a first set of design solutions;
  - display, via a graphical user interface (GUI), the approximate solution; and
  - after displaying the approximate solution, transmit the problem specification to a second solution engine resident within a server machine to generate a second set of design solutions, wherein the second solution engine expends greater computational resources to generate design solutions than the first solution engine.

22. The system of claim 21, wherein the processor further configured to determine that a first version of the problem specification does not satisfy the minimum input requirements for the solution engine;
- determine a modification to the first version of the problem specification that would cause the problem specification to satisfy the minimum input requirements for the solution engine; and
- incorporate the modification into the first version of the problem specification to generate a problem specification that satisfies the minimum input requirements for the solution engine.

23. The one or more non-transitory computer-readable media of claim 1, wherein the design problem geometry comprises a three-dimensional (3D) geometry.

* * * * *